(12) United States Patent
Balm et al.

(10) Patent No.: US 9,172,127 B2
(45) Date of Patent: Oct. 27, 2015

(54) COUPLER AND AMPLIFIER ARRANGEMENT

(75) Inventors: Bart Balm, AP Kekerdom (NL);
Boudewijn Charite, VG Breda (NL);
Tomas Fric, Am Berg En Dal (NL)

(73) Assignee: EPCOS AG, Munich (DE)

( * ) Notice: Subject to any disclaimer, the term of this patent is extended or adjusted under 35 U.S.C. 154(b) by 635 days.

(21) Appl. No.: 13/515,493

(22) PCT Filed: Dec. 15, 2009

(86) PCT No.: PCT/EP2009/067210
§ 371 (c)(1),
(2), (4) Date: Aug. 24, 2012

(87) PCT Pub. No.: WO2011/072723
PCT Pub. Date: Jun. 23, 2011

(65) Prior Publication Data
US 2012/0326780 A1   Dec. 27, 2012

(51) Int. Cl.
*H01P 5/18* (2006.01)
*H03F 3/60* (2006.01)

(52) U.S. Cl.
CPC ............ *H01P 5/187* (2013.01); *H01P 5/185* (2013.01); *H03F 3/602* (2013.01)

(58) Field of Classification Search
CPC ............ H01P 5/187; H01P 5/04; H01P 5/185
USPC .................................................. 333/109, 112
See application file for complete search history.

(56) References Cited

U.S. PATENT DOCUMENTS

| | | |
|---|---|---|
| 5,313,175 A | 5/1994 | Bahl et al. |
| 5,497,137 A | 3/1996 | Fujiki |
| 6,407,647 B1 | 6/2002 | Apel et al. |
| 6,515,556 B1 | 2/2003 | Kato et al. |
| 6,636,126 B1 | 10/2003 | Pozdeev |
| 6,639,490 B2 | 10/2003 | Chominski |
| 7,034,633 B2 | 4/2006 | Passiopoulos et al. |
| 7,336,142 B2 | 2/2008 | Vogel |
| 7,592,881 B2 * | 9/2009 | Salomon ..................... 333/117 |
| 2002/0175775 A1 | 11/2002 | Lillo et al. |
| 2003/0076191 A1 | 4/2003 | Iida et al. |
| 2004/0119559 A1 | 6/2004 | Shumovich |

(Continued)

FOREIGN PATENT DOCUMENTS

| | | |
|---|---|---|
| EP | 1796204 | 6/2007 |
| JP | 05-206763 A | 8/1993 |

(Continued)

OTHER PUBLICATIONS

Mongia et al., "Spiral Transformers", RF and Microwave Coupled Line Circuits, May 31, 1999, pp. 383-387.

(Continued)

*Primary Examiner* — Barbara Summons
*Assistant Examiner* — Erfan Faneian
(74) *Attorney, Agent, or Firm* — McDermott Will & Emery LLP (57) ABSTRACT

A coupler comprises a first line and a second line which is broadside coupled to the first line in a first and a second section. The capacitance between the first and the second line per length unit of the first line is larger in the first section in comparison to the second section. The first and the second line form a first turn.

19 Claims, 4 Drawing Sheets

(56) References Cited

U.S. PATENT DOCUMENTS

| | | | |
|---|---|---|---|
| 2004/0233014 A1* | 11/2004 | Juenemann et al. | 333/109 |
| 2005/0122185 A1 | 6/2005 | Podell | |
| 2005/0122186 A1* | 6/2005 | Podell | 333/112 |
| 2005/0146394 A1 | 7/2005 | Podell | |
| 2007/0176727 A1 | 8/2007 | Chen et al. | |

FOREIGN PATENT DOCUMENTS

| | | |
|---|---|---|
| JP | 2003-133817 A | 5/2003 |
| JP | 2005-168072 A | 6/2005 |
| JP | 2008-078853 A | 4/2008 |
| JP | 2008-244924 A | 10/2008 |
| JP | 2009-525638 A | 7/2009 |
| JP | 05-029850 B2 | 9/2012 |
| WO | 2009081179 A1 | 7/2009 |

OTHER PUBLICATIONS

Rizzi, "The branch-line coupler", Microwave Engineering Passive Circuits, Dec. 11, 1987, pp. 377-380.

Vendelin et al., "Single-Balanced Mixers", Microwave Circuit Design, Jul. 5, 2005, pp. 537-539.

* cited by examiner

⊠ = section with first thickness T1

FIG 2B

⊠ = via

COUPLER AND AMPLIFIER ARRANGEMENT

The present invention relates to a coupler and an amplifier arrangement.

A coupler comprises a pair of coupled lines. High-frequency signals are often provided to the coupler. Thus, the two lines effect a capacitive or an inductive coupling of the high-frequency signals.

Documents US 2002/0175775 A1, U.S. Pat. No. 6,407,647 B1 and U.S. Pat. No. 6,639,490 B2 describe spiral couplers. Documents U.S. Pat. No. 5,313,175, U.S. Pat. No. 7,034,633 B2 and U.S. Pat. No. 7,336,142 B2 show couplers comprising two lines, wherein a capacitive coupling is achieved between the two lines. These couplers require a large area on a substrate.

It is an object of the invention to provide a coupler and an amplifier arrangement which require only a small area on a substrate.

This object is achieved by a coupler according to claim 1 and an amplifier arrangement according to claim 15. Embodiments of the coupler are given in dependent claims.

A coupler comprises a first line and a second line. The first and the second line are broadside coupled in a first and a second section. The first and the second line form a first turn. The capacitance between the first and the second line per length unit of the first line is larger in the first section in comparison to the second section.

It is an advantage of the coupler that both, an inductive coupling and a capacitive coupling are achieved so that only a small area on a substrate is required. The capacitive coupling is provided by the broadside orientation of the first line to the second line. Furthermore, the capacitive coupling is different in the sections of the first and second line. The capacitive coupling is increased in the first section in comparison to the second section.

In an embodiment, the broadside coupling of the first line to the second line is realized by a vertical adjustment of the first line to the second line. Thus, the capacitance between the first and the second line per length unit of the first line is equal to the capacitance between the first and the second line per length unit of the second line.

In an embodiment, the first section is located within the first turn. Thus, a section of the first line which forms the first turn comprises the first section or at least a part of the first section. The increased capacitance is advantageously realized inside of the outline of the first and the second line of the first turn.

In an embodiment, the coupler comprises a first capacitor. The first capacitor increases the capacitance between the first and the second line per length unit in the first section in comparison to the second section. The first line can be electrically connected to a first electrode of the first capacitor. The second line can be electrically connected to a second electrode of the first capacitor. The first capacitor can be realized as a parallel plate capacitor or an interdigitated capacitor.

The coupler comprises a dielectric layer which is arranged between the first and the second line.

In an embodiment, the thickness of the dielectric layer in the first section is equal to the thickness of the dielectric layer in the second section. The first line and the second line have a first width in the first section. The first line and the second line have a line width in the second section. The first width may be larger than the line width. Thus, the capacitance per length unit of the first line is increased by the larger width of the first and the second line in the first section compared with the second section.

In an alternative embodiment, the dielectric layer has a first thickness in the first section and a second thickness in the second section. The second thickness is larger than the first thickness. Thus, a higher capacitance per length unit of the first line is achieved by the lower thickness of the dielectric layer in the first section in comparison to the second section. The first capacitor can be realized as a parallel plate capacitor. A section of the first line layer may form the first electrode of the first capacitor. A section of the second line may form the second electrode of the first capacitor. Alternatively, at least one of the first and the second line is connected by means of a connection line or a via to the corresponding electrode of the first capacitor.

The first turn can be implemented as a spiral or a winding. The first turn can cover an angle of more than 360 degree. The first line of the first turn can be implemented as a primary winding and the second line of the first turn can be implemented as secondary winding. The primary winding and the secondary winding can be coupled. They may be coupled in-phase or not in-phase. The first turn can comprise a first crossing.

In an embodiment, the coupler comprises a first and second metal layer. The first line is arranged in the first metal layer with the exception of the first crossing. Correspondingly, the second line is arranged in the second metal layer with the exception of the first crossing. Thus, the first line is arranged in more than half of the first turn in the first metal layer. The second line is arranged in more than half of the first turn in the second metal layer.

In an embodiment, the first crossing comprises line sections and vias which are located in the first and the second metal layer and between the first and the second metal layer, respectively.

In an embodiment, the line sections and the vias which form the first crossing are located in the first and the second metal layer as well as between the first and the second metal layer, respectively. The line sections which form the first crossing can be located in the first and the second metal layer, respectively. The vias which form the first crossing are located between the first and the second metal layer.

In a further development, all line sections and all vias which are required to form the first crossing are located in the first and the second metal layer as well as between the first and the second metal layer, respectively. Advantageously, a third metal layer or a bond wire is not required to form the first crossing. This leads to a compact realization of the first crossing with high cost efficiency.

The first crossing is a horizontal crossing. Thus, the first crossing can be seen in a top view of the coupler. The coupler is arranged on a surface of a substrate. The substrate may be a carrier. The first crossing is visible in a projection towards the surface of the substrate. The first crossing comprises a first, a second, a third and a fourth arm. The first, the second, the third and the fourth arm is visible in the projection towards the surface of the substrate. The third arm is opposite to the first arm. The fourth arm is opposite to the second arm. Each of the four arms comprises a line section of the first line and a line section of the second line. The first arm and the second arm encompass an angle of 90°. The first arm and the fourth arm also encompass an angle of 90°. Further on, the second arm and the third arm encompass an angle of 90°. Consequently, the third arm and the fourth arm encompass an angle of 90° in the projection towards the surface of the substrate. The length of each of the arms is less than a quarter of the first turn.

In an embodiment, at an end of the first arm and at an end of the second arm, the first line is arranged in the first metal layer and the second line is arranged in the second metal layer. In the first arm, the first line is located in the first metal layer and the second line changes from the second metal layer to the first metal layer. Contrary to that, in the second arm, the first line changes from the first metal layer to the second metal layer and the second line is located in the second metal layer. Thus, a line section of the first line and a line section of the second line are located in the first metal layer at the center of the crossing. Moreover, a line section of the first line and a line section of the second line are located in the second metal layer at the center of the first crossing.

In a further embodiment, the first and the second line form a second turn. The second turn is separated from the first turn. The second turn is located beneath the first turn. The second turn is located lateral to the first turn in the projection towards the surface of the substrate.

The second turn can have a second crossing. The second crossing may be a horizontal crossing in the projection towards the surface of the substrate.

In a development, the second turn comprises a third section such that the capacitance between the first and the second line per length unit of the first line is larger in the third section in comparison to the second section. The third section can be realized such as the first section. A second capacitor is realized by means of the third section. The first and the second capacitor can be on-chip capacitors.

In an embodiment, the first line is arranged in more than half of the second turn in the second metal layer and the second line is arranged in more than half of the second turn in the first metal layer.

In an embodiment, an amplifier arrangement comprises a first and a second coupler as well as a first and a second amplifier. At least one of the first and the second coupler is implemented as the coupler described above. The first coupler couples an input of the amplifier arrangement to an input of the first amplifier and to an input of the second amplifier. The second coupler couples an output of the first amplifier and an output of the second amplifier to an output of the amplifier arrangement.

The invention is described in more details by referring to the embodiments and the relating figures. Devices and structures with the same effect are denoted by equal reference numerals. A description of a part of a circuit or a device or a structure having the same function in different figures will not be repeated in each of the following figures.

Figure 1A:
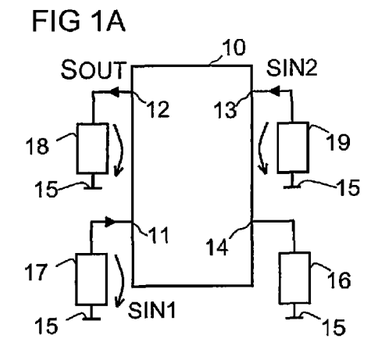
FIGS. 1A to 1D show circuit diagrams of exemplary couplers according to the invention.

FIG. 1A shows an exemplary circuit diagram of a coupler used as power combiner. The coupler 10 comprises a first, a second, a third and a fourth terminal 11 to 14. A terminal can also be denoted as a port or terminus. The first terminal 11 and the third terminal 13 are implemented as input terminals. The second terminal 12 and the fourth terminal 14 are implemented as output or isolated terminals. The first, the second, the third and the fourth terminal 11 to 14 have a first, a second, a third and a fourth characteristic impedance 17, 18, 19, 16 towards the reference potential terminal 15, respectively.

A first input signal SIN1 is provided to the first terminal 11 and a second input signal SIN2 is applied to the third terminal 13. The second input signal SIN2 is designed such that the second input signal SIN2 has a phase relation of 90° in relation to the first input signal SIN1. An output signal SOUT is generated by the coupler 10 at the second terminal 12.

The coupler 10 is implemented as a four terminal hybrid. The coupler 10 is realized as a power combiner or as a power splitter.

Figure 1B:
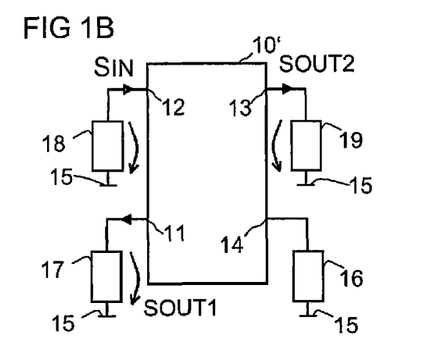

FIG. 1B shows a further exemplary circuit diagram of the coupler used as power splitter. The coupler 10' of FIG. 1B is a further development of the coupler 10 shown in FIG. 1A. The coupler 10' comprises the first, the second, the third and the fourth terminal 11 to 14. A terminal can also be denoted as a port or terminus. The first terminal 11 and the third terminal 13 are implemented as output terminals. The second terminal 12 and the fourth terminal 14 are implemented as input or isolated terminals. The first, the second, the third and the fourth terminal 11 to 14 have the first, the second, the third and the fourth characteristic impedance 17, 18, 19, 16 to the reference potential terminal 15, respectively.

An input signal SIN is provided to the second terminal 12. A first and a second output signal SOUT1, SOUT2 is generated by the coupler 10' at the first terminal 11 and the third terminal 13. If a test signal is applied to the second terminal 12 as the input signal SIN, the first output signal SOUT1 has a 90° phase relation to the second output signal SOUT2.

Figure 1C:
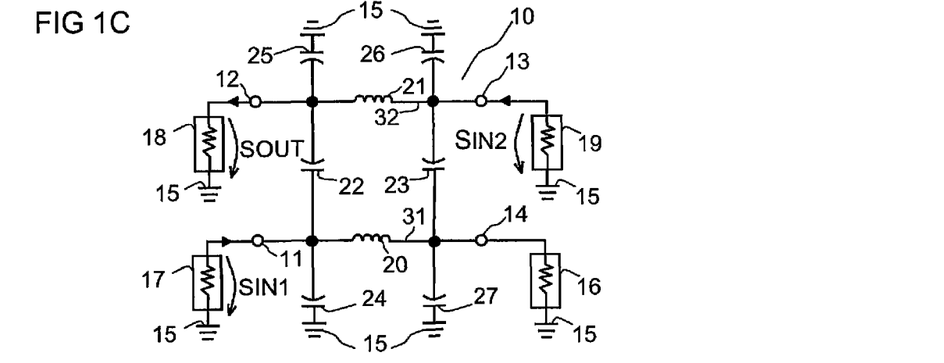

FIG. 1C shows a further circuit diagram of an exemplary coupler which is a further development of the coupler 10 shown in FIGS. 1A and 1B. A first inductor 20 couples the first terminal 11 to the fourth terminal 14. A second inductor 21 couples the second terminal 12 to the third terminal 13. The first and the second inductor 20, 21 are implemented as lumped inductors with a high mutual coupling coefficient. A first capacitor 22 couples the first terminal 11 to the second terminal 12. Correspondingly, a second capacitor 23 couples the fourth terminal 14 to the third terminal 13. The inductivity value of the first inductor 20 is equal to the inductivity value of the second inductor 21. The capacitance value of the first capacitor 22 is equal to the capacitance value of the second capacitor 23. A third capacitor 24 couples the first terminal 11 to the reference potential terminal 15. Similarly, a fourth, a fifth and a sixth capacitor 25, 26, 27 couple the second, the third and the fourth terminal 12, 13, 14 to the reference potential terminal 15, respectively. The capacitance values of the third, the fourth, the fifth and the sixth capacitor 24 to 27 are equal. In accordance with FIGS. 1A and 1B, the first and the third terminals 11, 13 are realized as input or output terminals. The second terminal 12 can be realized as a terminal out of a group comprising a single-ended output terminal, a single-ended input terminal or an isolated terminal. Similarly, the fourth terminal 14 can be implemented as a terminal out of a group comprising a single-ended output terminal, a single-ended input terminal or an isolated terminal. The coupler 10 comprising the first and the second inductor 20, 21 and the first and the second capacitor 22, 23 is realized by a first and a second line 31, 32. The first and the second lines 31, 32 are broadside coupled. The first and the second lines 31, 32 are vertically aligned lines. The first and the second lines 31, 32 are realized as transmission lines. The first and the second lines 31, 32 are folded. The first line 31 couples the first terminal 11 to the fourth terminal 14. The second line 32 couples the second terminal 12 to the third terminal 13.

Since the coupler 10 is implemented as a tightly coupled structure, a low loss advantageously can be achieved. The inductance value L of the first and the second inductor 20, 21, the mutual inductance M between the first and the second line 31, 32, the capacitance value Cc of the first and the second capacitor 22, 23 and the capacitance value Cp of the third, fourth, fifth and sixth capacitor 24 to 27 can be calculated according to the following equations:

$$L = \frac{(Z_{0_e} + Z_{0_0}) \cdot \sin\theta}{4\pi f_0},$$

$$M = \frac{(Z_{0_e} + Z_{0_0}) \cdot \sin\theta}{4\pi f_0},$$

$$Cc = \left(\frac{1}{Z_{0_0}} - \frac{1}{Z_{0_e}}\right)\frac{\tan\left(\frac{\theta}{2}\right)}{4\pi f_0} \text{ and}$$

$$Cp = \frac{\tan\left(\frac{\theta}{2}\right)}{Z_{0_e} 2\pi f_0},$$

wherein $Z_{0_e}$ is an even mode impedance. $Z_{0_0}$ is an odd mode impedance, $f_0$ is a design frequency or a centre frequency, and θ is a wanted phase shift or a set design shift.

Figure 1D:
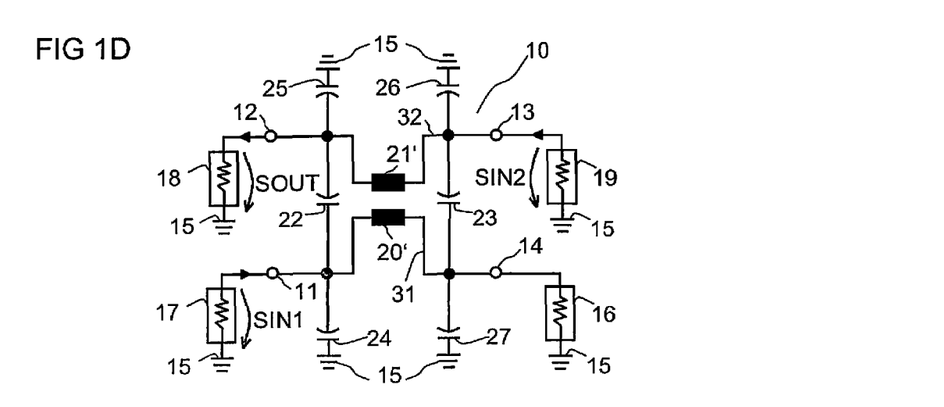

FIG. 1D shows a circuit diagram of an exemplary coupler 10 that is a further development of the coupler 10 shown in FIGS. 1A to 1C. The first and the second lines 31, 32 are implemented as striplines. Thus, the first and the second lines 31, 32 are folded broadside coupled striplines. Therefore, a value of a mutual inductor coupling coefficient k≈1 can be achieved. If the wanted phase shift θ=90°, the above described equations can be simplified to the following equations:

$$L = M = \frac{Z_0}{2\pi f_0},$$

$$Cc = \frac{1}{4\pi f_0 Z_0} \text{ and}$$

$$Cp \approx 0,$$

wherein $Z_0$ is the characteristic impedance or a port impedance. Thus, the first, the second, the third and the fourth characteristic impedance 17, 18, 19, 16 have the value $Z_0$. The coupler 10 is realized by a chip technology. The coupler 10 can be integrated on a chip. It is an advantage of the chip technology that tightly broadside coupled striplines can be realized. The first and the second inductor 20, 21 can be realized on one substrate 80. Moreover, the first and the second capacitor 22, 23 can be implemented as metal/isolator/metal capacitors, abbreviated MIM capacitors. The electrodes of the MIM capacitors are provided by a first and a second metal layer 43, 48. Alternatively, the electrodes of the MIM capacitors are placed between the first and the second metal layer 43, 48. This arrangement of the inductors 20, 21 and capacitors 22, 23 requires only a small area on the substrate 80.

In an alternative embodiment, the coupler 10 does not comprise the third, fourth, fifth and sixth capacitor 24 to 27. These four capacitors 24 to 27 are omitted and replaced by open-circuits.

Figure 2A:
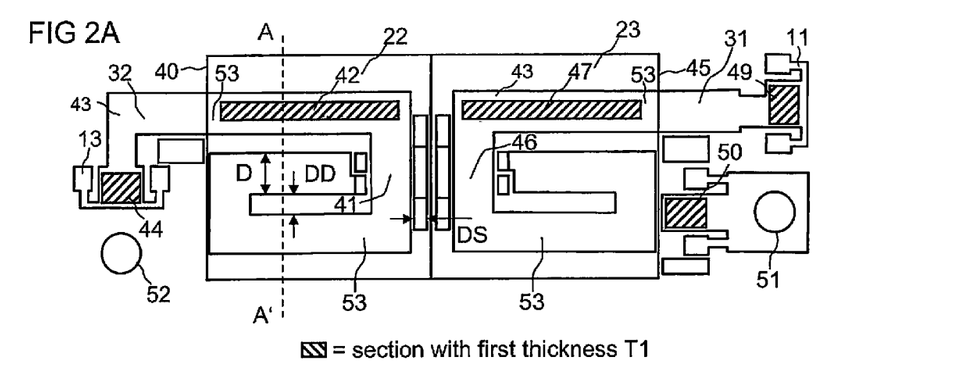
FIGS. 2A to 2D show top views and a cross-section of an exemplary coupler according to the invention.
Figure 2B:
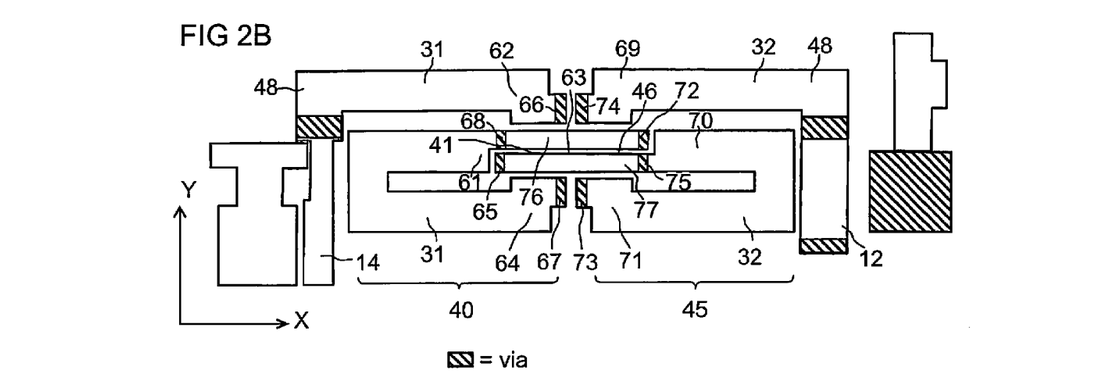
Figure 2C:
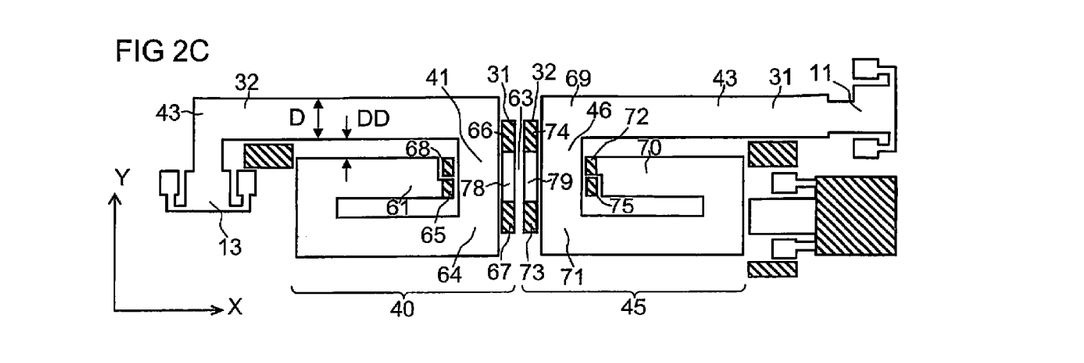

FIG. 2A shows a top view of an exemplary coupler which is a further development of the coupler 10 shown in FIGS. 1A to 1D. The first line and the second line 31, 32 are broadside coupled. In FIGS. 2A to 2C, the third and the fourth terminal 13, 14 are sited on the left-hand side and the first and the second terminal 11, 12 are sited on the right-hand side. FIG. 2A shows a projection towards a surface of the substrate. In the projection, the second metal layer 43 is shown. The first metal layer 48 is between the second metal layer 43 and the surface of the substrate. The second metal layer 43 can also be denoted as upper metallization layer and the first metal layer 48 can be denoted as lower metallization layer. Thus, the upper one of the first and the second line 31, 32 can be seen in the top view of FIG. 2A. The coupler 10 comprises a first turn 40 on the left-hand side. The first turn 40 comprises a first crossing 41.

Furthermore, the first line 31 comprises a first section 42 for the realization of a first capacitor 22 and a second section 53. The first section 42 is comprised by the first turn 40. The first turn 40 covers an angle of more than 360°. The second line 32 is arranged in the second metal layer 43 in most parts of the first turn 40. The third terminal 13 is located in the second metal layer 43. A first tuning capacitor 44 couples the third terminal 13 to the fourth terminal 14. The first tuning capacitor 44 is located nearby the third and the fourth terminal 13, 14.

Furthermore, the coupler 10 comprises a second turn 45. The second turn 45 is arranged besides the first turn 40. In the projection towards the surface of the substrate 80 shown in FIG. 2A, the second turn 45 and the first turn 40 are arranged side by side. The second turn 45 comprises a second crossing 46. The second crossing 46 is located adjacent to the first crossing 41. Thus, the first and the second crossing 41, 46 form a double crossing. The first line 31 forms most part of the second turn 45. In addition, the coupler 10 comprises a third section 47 for the realization of the second capacitor 23. The third section 47 is located inside the second turn 45. The coupler 10 comprises a second tuning capacitor 49. The second tuning capacitor 49 couples the first terminal 11 to the second terminal 12. The first and the second capacitors 22, 23 are located between the second metal layer 43 and the first metal layer 48.

In addition, the coupler 10 comprises a third tuning capacitor 50. The coupler 10 comprises a first and a second via 51, 52. The first via 51 connects the second metal layer 43 to a further surface of the substrate 80. The further surface is the backside of the substrate 80. The second via 52 connects the first metal layer 48 to the further surface. The first and the second line 31, 32 comprise rectangular line sections. The first and the second turn 40, 45 obtain a clockwise rotation.

The second line 32 has the line width D. The distance DD between different line sections of the second line 32 of the first turn 40 is the minimum distance according to a set of design rules for the fabrication of the coupler 10. Thus, the first turn 40 requires only a small space on the substrate 80. Advantageously, the coupler 10 requires no additional area for the realization of the first and the second capacitor 22, 23.

In an alternative, not shown embodiment, the first and the second line 31, 32 comprise rounded line sections.

In an alternative, not shown embodiment, only one turn of the first and the second turn 40, 45 has a clockwise rotation and the further turn of the first and the second turn 40, 45 has a counter-clockwise rotation. Alternatively, the first and the second turn 40, 45 has a counter-clockwise rotation.

FIG. 2B shows a top view of the first metal layer 48 of the coupler 10 shown in FIG. 2A. In more than half of the first turn 40, the first line 31 is arranged in the first metal layer 48. The first crossing 41 has a first, a second, a third and a fourth arm 61 to 64. The third arm 63 is opposite the first arm 61. Correspondingly, the fourth arm 64 is opposite the second arm 62. The third arm 63 extends in the x-direction, whereas the first arm 61 extends in the −x-direction. The second arm 62 extends in the y-direction and the fourth arm 64 extends in the −y-direction. In the first arm 61, the first line 31 is arranged in the first metal layer 48 and the second line 32 changes from the second metal layer 43 to the first metal layer 48 via a first via 65. In the second arm 62, the first line 31 changes from the first metal layer 48 to the second metal layer 43 via a second via 66. In the third arm 63, the first and the second line 31, 32 are located in the first metal layer 48. In the fourth arm 64, the first line 31 changes from the second metal layer 43 to the first metal layer 48 via a third via 67.

The second crossing 46 also comprises four arms 63, 69, 70, 71. A first arm of the second crossing 46 is equal to the third arm 63 of the first crossing 40. A third arm 70 of the second crossing 46 is opposite the first arm 63 of the second crossing 46. A second arm 69 of the second crossing 46 is opposite a fourth arm 71 of the second crossing 46. The first arm 63 of the second crossing 46 extends in the −x-direction seen from the second crossing 46. The third arm 70 extends in the x-direction of the second crossing 46. The second arm 69 extends in the y-direction from the second crossing 46 and the fourth arm 71 extends in the −y-direction from the second crossing 46. In the first arm 63 of the second crossing 46, the first and the second metal line 31, 32 are arranged in the first metal layer 48. In the third arm 70 of the second crossing 46, the first line 31 changes from the first metal layer 48 to the second metal layer 43 via a fourth via 72. The second line 32 is arranged in the third arm 70 of the second crossing 46 in the first metal layer 48. In the fourth arm 71 of the second crossing 46, the second line 32 changes from the first metal layer 48 to the second metal layer 43 via a fifth via 73. In the second arm 69 of the second crossing 46, the second line 32 changes from the second metal layer 43 to the first metal layer 48 via a sixth via 74.

On the left-hand side, the first line 31 comprises the fourth terminal 14 of the coupler 10. On the right-hand side, the second line 32 comprises the second terminal 12 of the coupler 10.

FIG. 2C shows the second metal layer 43 of the coupler 10 shown in FIGS. 2A and 2B. The second line 32 is located in more than half of the first turn 40 in the second metal layer 43. The first line 31 has a seventh via 68 in the first arm 61 of the first crossing 40. No line sections are connected to the seventh via 68 in the second metal layer 43. By means of the seventh via 68, a better symmetry of the coupler 10 is achieved. In the second and the fourth arm 62, 64 of the first turn 40, the second line 32 is located and the first line 31 changes from the first metal layer 48 to the second metal layer 43 by means of the second and the third vias 66, 67. In the second and the fourth arm 62, 64 of the first turn 40, the first line 31 has a third line section 78 in the second metal layer 43. The second line 32 has a line width D in more than half of the first turn 40 and in the second and the fourth arm 62, 64 of the first turn 40. Contrary to this, the first line 31 has a small line width DS in the second and the fourth arm 62, 64. The small line width DS is smaller than the line width D.

In more than half of the second turn 45, the first line 31 is located in the second metal layer 43. The first line 31 has also the line width D in more than half of the second turn 45. The first line 31 has the line width D in the second and the fourth arm 69, 71 of the second crossing 46. In the second and the fourth arm 69, 71 of the second crossing 45, the first line 31 is arranged in the second metal layer 43 and the second line 32 comprises a fourth line section 79 in the second metal layer 43. In the third arm 70, an eighth via 75 is located which is connected by the second line 32. No line section is connected to the eighth via 75 in the second metal layer 43. On the left-hand side, the second line 32 comprises the third terminal 13. On the right-hand side, the first line 31 comprises the first terminal 11. The first line 31 and the second line 32 have the same folded structure with the exception of the first and second crossing 41, 46.

It is an advantage of the coupler 10 that the first and the second crossing 41, 46 only comprises line sections in the first and the second metal layer 43, 48 and the first to the sixth vias 65, 66, 67, 72, 73, 74 between the first metal layer 48 and the second metal layer 43. Bond wires are not required to realize the first and the second crossing 41, 46. Furthermore, a third or fourth metal layer is not required for the implementation of the first and the second crossing 41, 46. The inductors 20, 21 are not realized as a wirewound- or air-coil. The coupler 10 obtains a low loss.

In an alternative, not shown embodiment, the coupler 10 comprises the first turn 40, but not the second turn 45. Alternatively, the coupler 10 comprises more than two turns.

Figure 2D:
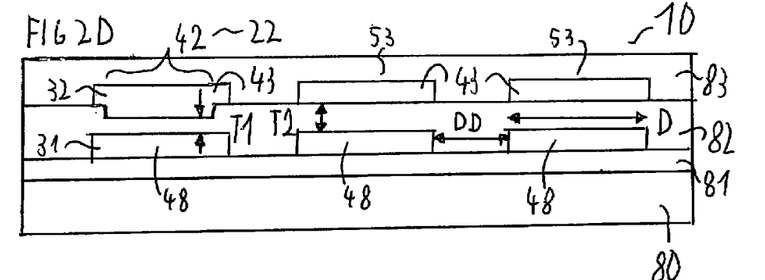

FIG. 2D shows a cross-section of the coupler 10 at the line AA' of FIG. 2A. The coupler 10 is deposited on the substrate 80. The substrate 80 is a semiconductor substrate or a printed circuit board or a ceramic. The ceramic may be a thin-film ceramic or a fine-line ceramic. A lower dielectric layer 81 is arranged on the substrate 80. The first metal layer 48 is located on the lower dielectric layer 81. A dielectric layer 82 is arranged on the first metal layer 48. The second metal layer 43 is located on the dielectric layer 82. An upper dielectric layer 83 is arranged on the second metal layer 43. In the cross-section A-A', the first metal layer 48 comprises line sections of the first line 31 and the second metal layer 43 comprises line sections of the second line 32. The dielectric layer 82 has a second thickness T2 between the first metal layer 48 and the second metal layer 43 in the second section 53. The second thickness T2 may be 200 nm. The second section 53 comprises the first and second line 31, 32 with the exception of the first and the third section 42, 47. In the first section 42, the dielectric layer 82 has a first thickness T1. The first thickness T1 is smaller than the second thickness T2. The first thickness T1 may be 50 nm. The dielectric layer 82 in the first section 42 may comprise silicon dioxide. Therefore, the coupling between the first and the second line 31, 32 per length unit is higher in the first section 42 in comparison to the second section 53. The third section 47 is fabricated such as the first section 42. The second capacitor 23 is realized such as the first capacitor 22. Furthermore, the first, the second and the third tuning capacitors 44, 49, 50 are also implemented by means of areas, wherein the dielectric layer 82 has the first thickness T1.

The first and the second capacitor 22, 23 and the three tuning capacitors 44, 49, 50 are advantageously realized between the first and the second line 31, 32 and are realized as buried on-chip capacitors. Thus, no additional space on the substrate 80 is required for the realization of these capacitors. Further on, contact areas for connections to external capacitors are not required.

Figure 3A:
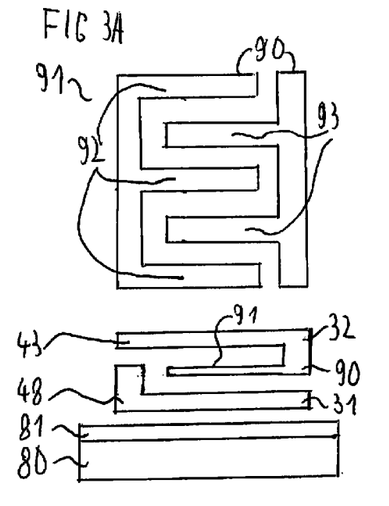
FIGS. 3A and 3B show capacitors of an exemplary coupler according to the invention.

FIG. 3A shows an exemplary alternative embodiment of the first capacitor 22 which can be used in the coupler 10 shown in FIGS. 1A to 1D and 2A to 2D. The second capacitor 23 and the first, the second and the third tuning capacitors 44, 49, 50 can also be implemented such as the first capacitor 22 of FIG. 3A. The first capacitor 22 is realized as an interdigitated capacitor 91. The coupler 10 comprises a third metal layer 90. The interdigitated capacitor 91 is arranged in the third metal layer 90. FIG. 3A shows a top view on the third metal layer 90 and a cross section. The interdigitated capacitor 91 comprises a first number N of first electrodes 92 which are connected to the first line 31 and a second number M of second electrodes 93 which are connected to the second line 32. Vias are used for the connection of the first electrodes 92 to the first line 31 and of the second electrodes 93 to the second line 32. The first and the second electrodes 91, 93 are separated from the first and the second line 31, 32 by means of dielectric layers. The first number N of the first electrodes 92 has no electrical contact to the second number M of the second electrodes 93. The first and the second electrodes 92, 93 are realized in such a way that no short circuit between a first electrode 92 of the first number N and a second electrode 93 of the second number M occurs. The interdigitated capacitor 91 is a buried on-chip capacitor.

Figure 3B:
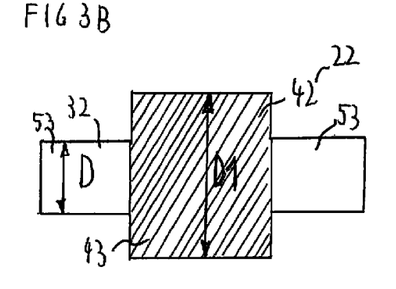

FIG. 3B shows a further exemplary embodiment of the first capacitor 22 which can be used in the coupler 10 shown in FIGS. 1A to 1D and 2A to 2D. The second capacitor 23 can also be implemented such as the first capacitor 22 of FIG. 3B. FIG. 3B shows a top view. The first capacitor 22 is realized as a parallel plate capacitor. The first and the second line 31, 32 have a first width D1 in the first section 42 which is larger in comparison to the line width D in the second section 53.

Figure 4:
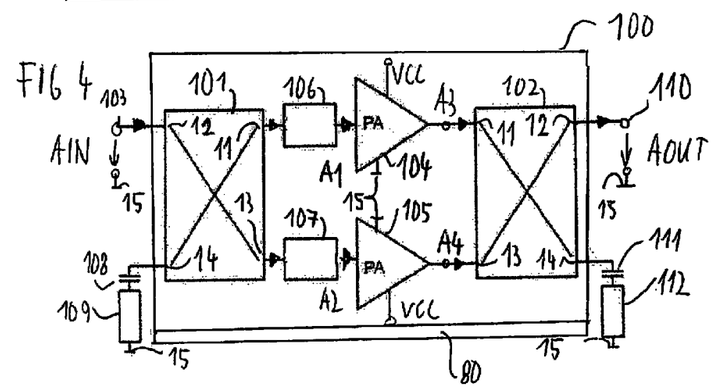
FIG. 4 shows an exemplary amplifier arrangement according to the invention and FIGS. 5A to 5G show exemplary simulation results of a coupler according to the invention.

FIG. 4 shows an exemplary amplifier arrangement 100. The amplifier arrangement 100 comprises a first and a second coupler 101, 102. The first coupler 101 is realized as the power splitter of FIG. 1B. The second coupler 102 is implemented as the power combiner of FIG. 1A. At least one of the first and the second coupler 101, 102 is realized as a coupler according to one of the FIGS. 1C, 1D, 2A to 2D, 3A and 3B. An input 103 of the amplifier arrangement 100 is connected to the second terminal 12 of the first coupler 101. The first terminal 11 of the first coupler 101 is coupled a first amplifier 104. The third terminal 13 of the first coupler 101 is coupled to a second amplifier 105. The first and the second amplifier 104, 105 are realized as power amplifiers. A first matching circuit 106 connects the first terminal 11 of the first coupler 101 to the first amplifier 104. A second matching circuit 107 connects the third terminal 13 of the first coupler 101 to the second amplifier 105. The first and the second matching circuit 106, 107 may comprise a coupler as described above with at least the first turn 40. The fourth terminal 14 of the first coupler 101 is coupled to the reference potential terminal 15 via a series circuit of an input capacitor 108 and an input resistor 109. An output of the first amplifier 104 is coupled to the first terminal 11 of the second coupler 102. An output of the second amplifier 105 is coupled to the third terminal 13 of the second coupler 102. The second terminal 12 of the second coupler 102 is coupled to an output 110 of the amplifier arrangement 100. The fourth terminal 14 of the second coupler 102 is connected to the reference potential terminal 15 via an output capacitor 111 and an output resistor 112.

The input signal AIN is provided to the input 103 of the amplifier arrangement 100. The input signal AIN is converted by the first coupler 101 into a first amplifier input signal A1 and a second amplifier input signal A2 which are provided to the first and the second amplifier 104, 105, respectively. The first and the second amplifier 104, 105 generate a first and a second amplifier output signal A3, A4. The amplifier output signals A3, A4 are provided to the second coupler 102 and are transformed into an amplifier output signal AOUT by means of the second coupler 102. The phase shift provided by the first coupler 101 is compensated by the phase shift provided by the second coupler 102.

The amplifier arrangement 100 of FIG. 4 is a final stage of a series of amplifier arrangements. The amplifier arrangement 100 is implemented as a quadrature power amplifier arrangement. The amplifier arrangement is of the balanced type. The amplifier arrangement 100 is integrated on the surface of the substrate 80. The first and the second amplifier 104, 105 are realized by means of the first and the second metal layer 43, 48 and the substrate 80. The substrate 80 is a semiconductor substrate such as silicon or a III-V group semiconductor, for example gallium-arsenide.

Figure 5A:
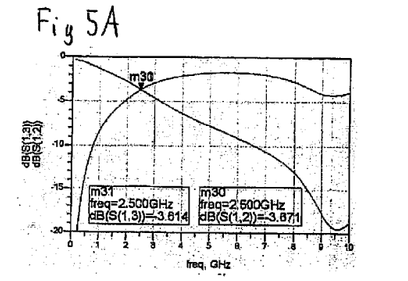
Figure 5B:
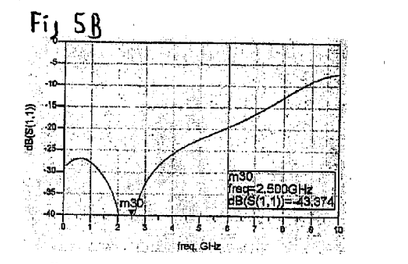
Figure 5C:
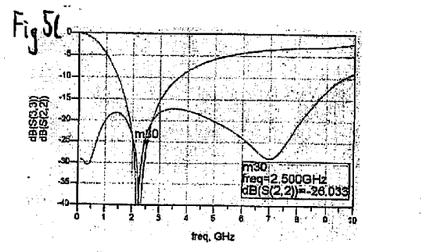
Figure 5D:
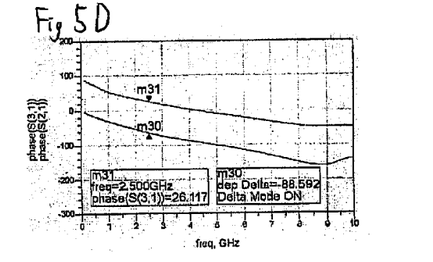
Figure 5E:
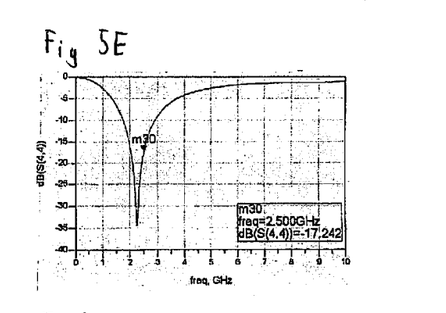
Figure 5F:
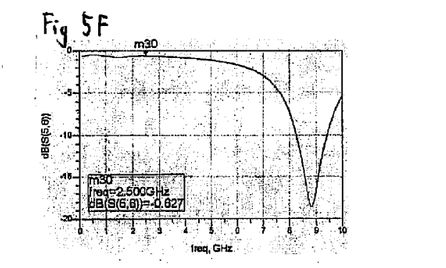
Figure 5G:
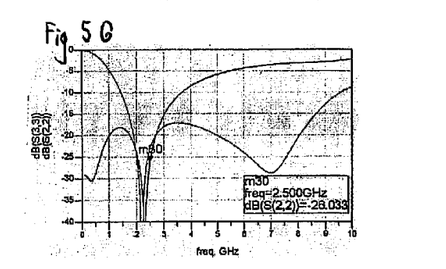

FIGS. 5A to 5G show exemplary characteristics of the coupler shown in FIGS. 1A to 1D and 2A to 2D. FIG. 5A shows the transfer function, FIG. 5B the return loss in case of single-ended terminals, FIG. 5C the return loss in case of differential terminals, FIG. 5D the phase between differential terminals, FIG. 5E the return loss of an isolation terminal, FIG. 5F the transfer function in differential mode and FIG. 5G the return loss in the differential mode. A terminal can also be denoted as a port. The signals and characteristics are shown dependent on the frequency f of a signal tapped at the coupler 10.

REFERENCE NUMERALS 10, 10' coupler
11 first terminal
12 second terminal
13 third terminal
14 fourth terminal
15 reference potential terminal
16 fourth characteristic impedance
17 first characteristic impedance
18 second characteristic impedance
19 third characteristic impedance
20, 20' first inductor
21, 21' second inductor
22 first capacitor
23 second capacitor
24 third capacitor
25 fourth capacitor
26 fifth capacitor
27 sixth capacitor
31 first line
32 second line
40 first turn
41 first crossing
42 first section
43 second metal layer
44 first tuning capacitor
45 second turn
46 second crossing
47 third section
48 first metal layer
49 second tuning capacitor
50 third tuning capacitor
51 first via
52 second via
53 second section
61 first arm
62 second arm
63 third arm
64 fourth arm
65 first via
66 second via
67 third via
68 seventh via
69 second arm
70 third arm
71 fourth arm
72 fourth via
73 fifth via
74 sixth via
75 eighth via
76 first line section
77 second line section
78 third line section
79 fourth line section 80 substrate
81 lower dielectric layer
82 dielectric layer
83 upper dielectric layer
90 third metal layer
91 interdigitated capacitor
92 first electrode
93 second electrode
100 amplifier arrangement
101 first coupler
102 second coupler
103 input
104 first amplifier
105 second amplifier
106 first matching circuit
107 second matching circuit
108 input capacitor
109 input resistor
110 output
111 output capacitor
112 output resistor
AIN input signal
AOUT output signal
A1 first amplifier input signal
A2 second amplifier input signal
A3 first amplifier output signal
A4 second amplifier output signal
D line width
DD distance
DS small line width
D1 first width
SIN input signal
SIN1 first input signal
SIN2 second input signal
SOUT output signal
SOUT1 first output signal
SOUT2 second output signal
T1 first thickness
T2 second thickness

The invention claimed is:

1. A coupler, comprising:
    a first line; and
    a second line which is broadside coupled to the first line in a first and a second section,
    wherein the coupler comprises a dielectric layer which is arranged between the first and the second line and has a first thickness in the first section and a second thickness in the second section as well as the second thickness is larger than the first thickness, the capacitance between the first and the second line per length unit of the first line is larger in the first section in comparison to the second section, and the first and the second line form a first turn,
    wherein the coupler comprises a first capacitor designed as a parallel plate capacitor and arranged in the first section,
    the first line is electrically connected to a first electrode of the first capacitor or a section of the first line forms the first electrode of the first capacitor, and
    the second line is electrically connected to a second electrode of the first capacitor or a section of the second line forms the second electrode of the first capacitor.

2. The coupler according to claim 1,
    wherein the first section is at least partially arranged within the first turn.

3. The coupler according to claim 1,
    wherein the coupler comprises a first and a second metal layer and the first line is arranged in more than half of the first turn in the first metal layer as well as the second line is arranged in more than half of the first turn in the second metal layer.

4. The coupler according to claim 1,
    wherein the first turn comprises a first crossing.

5. The coupler according to claim 4,
    wherein the first crossing comprises line sections and vias such that the line sections and the vias form the first crossing and are located in a first metal layer, a second metal layer and between the first and the second metal layer, respectively.

6. The coupler according to claim 4,
    wherein the first crossing is a horizontal crossing and has a first arm, a second arm, a third arm which is opposite to the first arm as well as a fourth arm which is opposite to the second arm,
        in the first arm, the first line is arranged in a first metal layer and the second line changes from a second metal layer to the first metal layer, and
        in the second arm, the first line changes from the first metal layer to the second metal layer and the second line is arranged in the second metal layer.

7. The coupler according to claim 1,
    wherein the first line comprises a first and a fourth terminal, the second line comprises a second and a third terminal, the first terminal is adjacent to the second terminal, the third terminal is adjacent to the fourth terminal, and the coupler is implemented as a at least one of a power combiner and a power splitter.

8. A coupler, comprising:
    a first line; and
    a second line which is broadside coupled to the first line in a first and a second section,
    wherein the coupler comprises a dielectric layer which is arranged between the first and the second line and has a first thickness in the first section and a second thickness in the second section as well as the second thickness is larger than the first thickness, the capacitance between the first and the second line per length unit of the first line is larger in the first section in comparison to the second section, and the first and the second line form a first turn,
    wherein the first turn comprises a first crossing,
    wherein the first crossing is a horizontal crossing and has a first arm, a second arm, a third arm which is opposite to the first arm as well as a fourth arm which is opposite to the second arm,
    in the first arm, the first line is arranged in a first metal layer and the second line changes from a second metal layer to the first metal layer, and
    in the second arm, the first line changes from the first metal layer to the second metal layer and the second line is arranged in the second metal layer,
    wherein
    in the third arm, the first and the second line are arranged in the first metal layer, and
    in the fourth arm, the second line is arranged in the second metal layer and the first line changes from the first metal layer to the second metal layer.

9. A coupler, comprising:
    a first line; and
    a second line which is broadside coupled to the first line in a first and a second section,
    wherein the coupler comprises a dielectric layer which is arranged between the first and the second line and has a first thickness in the first section and a second thickness in the second section as well as the second thickness is larger than the first thickness, the capacitance between the first and the second line per length unit of the first line is larger in the first section in comparison to the second section, and the first and the second line form a first turn, wherein the first and the second line form a second turn which is located lateral to the first turn and comprises a second crossing that is a horizontal crossing.

10. The coupler according to claim 9, wherein the second turn comprises a third section such that the capacitance between the first and the second line per length unit of the first line is larger in the third section in comparison to the second section.

11. The coupler according to claim 9, wherein the first line is arranged in more than half of the second turn in a second metal layer and the second line is arranged in more than half of the second turn in a first metal layer.

12. A coupler, comprising:

a first line; and a second line which is broadside coupled to the first line in a first and a second section, wherein the capacitance between the first and the second line per length unit of the first line is larger in the first section in comparison to the second section and the first and the second line form a first turn that comprises a first crossing, and wherein the first crossing is a horizontal crossing and has a first arm, a second arm, a third arm which is opposite to the first arm as well as a fourth arm which is opposite to the second arm, in the first arm, the first line is arranged in a first metal layer and the second line changes from a second metal layer to the first metal layer, and in the second arm, the first line changes from the first metal layer to the second metal layer and the second line is arranged in the second metal layer.

13. The coupler according to claim 12, wherein the first section is at least partially arranged within the first turn.

14. The coupler according to claim 12, wherein the coupler comprises the first and the second metal layer and the first line is arranged in more than half of the first turn in the first metal layer as well as the second line is arranged in more than half of the first turn in the second metal layer.

15. The coupler according to claim 12, wherein the first crossing comprises line sections and vias such that the line sections and the vias form the first crossing and are located in the first metal layer, the second metal layer and between the first and the second metal layer, respectively.

16. The coupler according to claim 12, wherein in the third arm, the first and the second line are arranged in the first metal layer, and in the fourth arm, the second line is arranged in the second metal layer and the first line changes from the first metal layer to the second metal layer.

17. The coupler according to claim 12, wherein the first and the second line form a second turn which is located lateral to the first turn and comprises a second crossing that is a horizontal crossing.

18. The coupler according to claim 17, wherein the second turn comprises a third section such that the capacitance between the first and the second line per length unit of the first line is larger in the third section in comparison to the second section.

19. The coupler according to claim 17, wherein the first line is arranged in more than half of the second turn in the second metal layer and the second line is arranged in more than half of the second turn in the first metal layer.

* * * * *